(12) United States Patent
Brand et al.

(10) Patent No.: US 9,875,794 B2
(45) Date of Patent: Jan. 23, 2018

(54) SENSING PHASE-CHANGE MEMORY/TEST CELLS FOR DETERMINING WHETHER A CELL RESISTANCE HAS CHANGED DUE TO THERMAL EXPOSURE

(71) Applicant: Micron Technology, Inc., Boise, ID (US)

(72) Inventors: Jason Brand, Placerville, CA (US); Jason Snodgress, Cameron Park, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/735,791

(22) Filed: Jan. 7, 2013

(65) Prior Publication Data

US 2013/0155767 A1 Jun. 20, 2013

Related U.S. Application Data

(63) Continuation of application No. 12/655,377, filed on Dec. 30, 2009, now Pat. No. 8,351,289.

(51) Int. Cl.
*G11C 7/04* (2006.01)
*G11C 13/00* (2006.01)
*G11C 29/50* (2006.01)

(52) U.S. Cl.
CPC ............ *G11C 13/0004* (2013.01); *G11C 7/04* (2013.01); *G11C 13/004* (2013.01); *G11C 13/0033* (2013.01); *G11C 29/50* (2013.01); *G11C 13/00* (2013.01); *G11C 2029/5002* (2013.01)

(58) Field of Classification Search
CPC ............ G11C 13/0011; G11C 13/0004; G11C 13/0033; G11C 13/0035; G11C 7/04
USPC ....... 365/148, 158, 163, 212, 211, 226, 228, 365/229
See application file for complete search history.

(56) References Cited

U.S. PATENT DOCUMENTS

| | | | |
|---|---|---|---|
| 4,210,024 A | 7/1980 | Ishiwatari et al. | |
| 7,283,396 B2 | 10/2007 | Bedarida et al. | |
| 7,623,401 B2 | 11/2009 | Philipp et al. | |
| 7,830,705 B2 | 11/2010 | Jeong | |
| 7,855,909 B1 * | 12/2010 | Sutardja | G11C 11/5678 365/148 |
| 7,952,908 B2 * | 5/2011 | Park | G11C 11/56 365/148 |
| 8,351,289 B1 * | 1/2013 | Brand et al. | 365/212 |
| 2010/0195372 A1 | 8/2010 | Toda | |
| 2012/0087183 A1 | 4/2012 | Chang | |

* cited by examiner

*Primary Examiner* — Andrew Q Tran
(74) *Attorney, Agent, or Firm* — Dorsey & Whitney LLP

(57) ABSTRACT

A phase change memory array may include at least one cell used to determine whether the array has been altered by thermal exposure over time. The cell may be the same or different from the other cells. In some embodiments, the cell is only read in response to an event. If, in response to that reading, it is determined that the cell has changed state or resistance, it may deduce whether the change is a result of thermal exposure. Corrective measures may then be taken.

13 Claims, 6 Drawing Sheets

SENSING PHASE-CHANGE MEMORY/TEST CELLS FOR DETERMINING WHETHER A CELL RESISTANCE HAS CHANGED DUE TO THERMAL EXPOSURE

CROSS-REFERENCE TO RELATED APPLICATION

This application is a continuation of U.S. patent application Ser. No. 12/655,377, filed Dec. 30, 2009. This application is incorporated by reference herein in its entirety and for all purposes.

BACKGROUND

This relates generally to phase change memories.

Phase change memory arrays are based upon memory elements that use a class of materials that have the property of switching between two phases having distinct electrical characteristics. Each of the phases may be associated with different crystallographic structures. The reset phase is associated with amorphous, disorderly structure, while the crystalline or polycrystalline phase, called the set phase, is an orderly structure.

The two phases, therefore, have distinct resistivities. In the chalcogenides, the resistivity varies by two or more orders of magnitude when the material passes from the amorphous phase to the crystalline phase and vice versa.

Thus, to reprogram the memory cell, heat may be applied to change the state of the cell. Unfortunately, the phase change memory cell may also change state over time in an undesirable way. The rate of change may be accelerated by exposure to high temperatures. The resulting bit alteration when exposed to cumulative high heat cycles for brief periods may reduce the useful lifetime of the phase change memory array.

DETAILED DESCRIPTION

In accordance with some embodiments of the present invention, canary or test cells may be formed within a phase change memory array. These cells may be read periodically to determine whether they have changed state or resistance level. Since these cells are not normally programmed or addressed in any way, they only change state as a result of the cumulative effect of heat exposure. By making these cells more sensitive to heat exposure, they tend to change, state sooner than any of the other cells, in some embodiments.

In another embodiment, no canary cells may be used. That is, conventional cells may be used and no special techniques may be needed to provide those cells. At periodic intervals, cells within the array may be read and/or their resistance sensed. If their resistance has changed from the programmed levels, this may be analyzed to determine whether or not thermal effects are adversely affecting the cells. For example, if a given number of cells changed their resistance by a given amount or in excess of a given threshold, the determination may be made that thermal induced failures are occurring or will soon occur. Corrective action may then be taken.

In accordance with still another embodiment, a conventional array may be used in conjunction with a canary array. That is, instead of dispersing the canary cells throughout the array, a separate array may be used, which may be separately addressed from the conventional array. This facilitates special fabrication processes to make the canary array cells, more sensitive to thermal failure than the conventional produced arrays in some embodiments.

Figure 1:
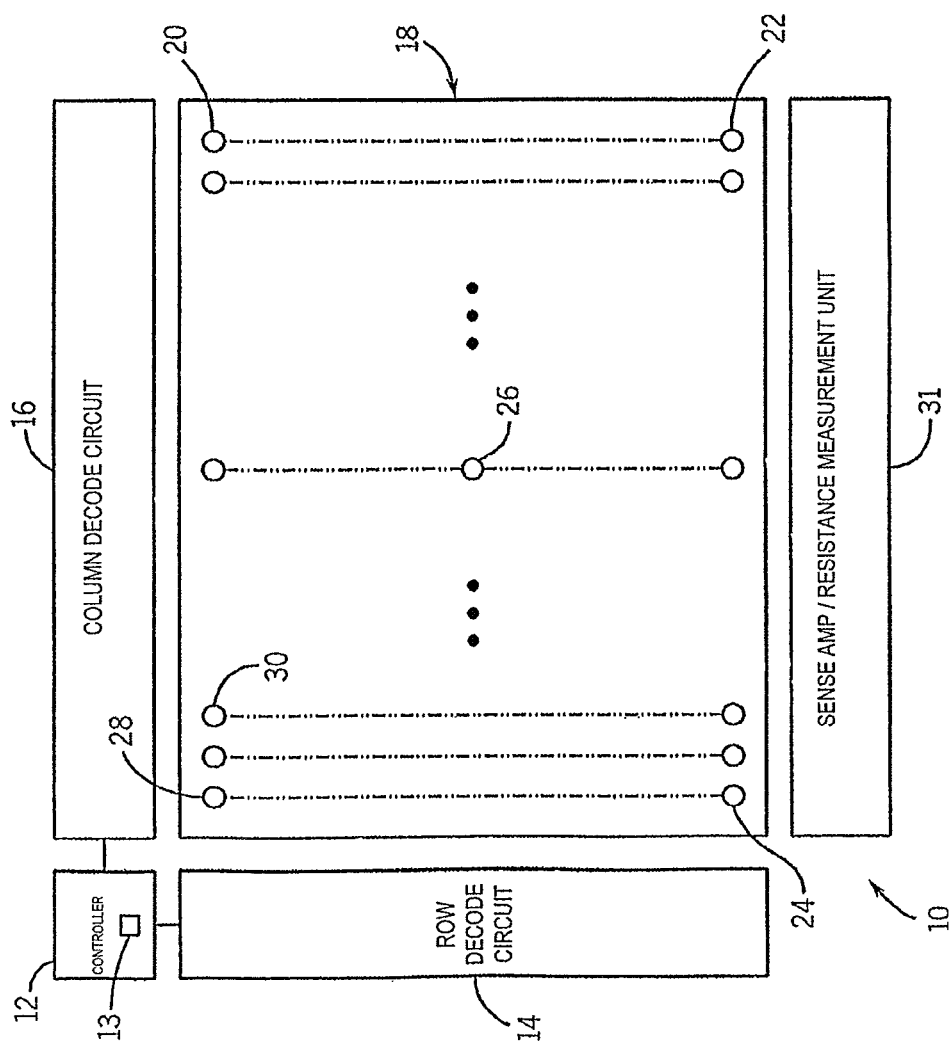
FIG. 1 is a schematic depiction of one embodiment of the present invention.

Referring to FIG. 1, a phase change memory array 10 may include an array 18 of memory cells. Conventionally, these memory cells 30 may be arranged in rows and columns, in what is called a cross point memory. By selecting a row and column, a memory cell at the intersection of that row and column, may be read, programmed, or verified.

Each memory cell generally includes at least a pair of spaced electrodes with an intervening chalcogenide material. In some cases, each memory cell also includes a select device, such as an MOS transistor or an ovonic threshold switch, to mention two examples.

The selection of cells in the array may be controlled by a column decode circuit 16 and a row decode circuit 14. The decode circuits 14 and 16 may be operated by a control or controller 12. The memory array may include a plurality of conventional memory cells, indicated in FIG. 1 by the reference numeral 30. It may also include a plurality of canary cells, indicated as 20, 22, 24, 26, and 28. In some embodiments, the canary cells may be distributed across the memory array in order to sense the heat or thermal budget of different regions of the array. Thus, in the illustrated embodiment, the canary cells are placed at the corners of the memory array and at its center. However, many other arrangements may also be used.

Conventionally, these canary cells are not addressed during normal operation. They do not store any data which is actually used. They have a state, but that state is only for purposes of determining whether or not the state has been adversely affected by thermal exposure. Thus, these cells are normally not addressed, they are not programmed in normal operation, and they are not read in normal operation. As a result, any state changes are a result of external factors.

In one embodiment, instead of simply determining whether the canary cells have changed state, an analysis may be done to determine whether they have changed resistance, without a change of state. Generally, thermal effects will cause cells to exhibit reduced resistance. By measuring the resistance of a plurality of cells, for example, in conjunction with sensing those cells, it may be determined whether the cells have already degraded or will some degrade as a result of thermal exposure.

To this end, a sense amplifier and resistance measurement unit 31 may be used. In the course of sensing these cells, the resistance of the cells may be determined based on current. Instead of simply comparing the current to a reference in order to determine whether or not the cell is programmed or not programmed, the current may be analyzed to determine the cell's resistance. This resistance measurement may then be compared to a threshold to see if the expected resistance of the cell differs materially from the actual resistance. Where the resistance is decreasing by more than a given threshold amount, it may be deduced that the cell is no longer reliable and that thermal effects are occurring.

In some embodiments, the canary cells may be configured differently than the other memory cells. For example, they may be formed in a way that they are more sensitive to heat exposure. As one example, it is known that doping with certain elements may improve thermal stability. In some embodiments, the doping may be withheld from material used to form the canary cells. For example, doping with silicon or nitrogen is known to improve thermal stability. As one example, the canary cells may not have such doping, while all of the other conventional cells in the array do.

One possible way to implement such an arrangement is to use ion implantation to increase the doping of the conventional memory cells and to withhold that ion implantation by appropriate masking from the canary memory cells. Therefore, the canary cells will be more prone to thermal instability.

At periodic intervals, the canary cells may be read to determine whether they have changed state. A table may be maintained within an appropriate memory, for example, within the control 12, to record the states of the canary cells. In some embodiments, some of the canary cells may be amorphous or reset and some of the cells may be set in order to get a fair distribution of affects of thermal exposure. In other embodiments, all of the canary cells may be the same, either the reset or the set state. Thus, at periodic intervals, the canary cells may be read, for example, when no other operation is going on within the device. As a result, the checking of the canary cells would not adversely affect performance.

In some embodiments, the canary cell check may be done based on the occurrence of an event such as a time out or timer setting. In other embodiments, it may be done based on a number of read or write cycles. In such devices, the number of cycles may be recorded and, at preprogrammed cycle number intervals, the canary cells may be checked. As still another example, every time the device is power cycled, the canary cells may be checked, either on power up or power down.

In the course of such a check, the control 12 simply selects each of the canary cells, one after another, and reads their states and compares the state of that canary cell to a value in a table stored in memory. If the state has changed, an alert is issued. As a result of the alert, a verify step may be implemented or all of the cells may simply be reprogrammed. In addition, it is desirable to reset the canary cells back to their initial states.

Figure 2:
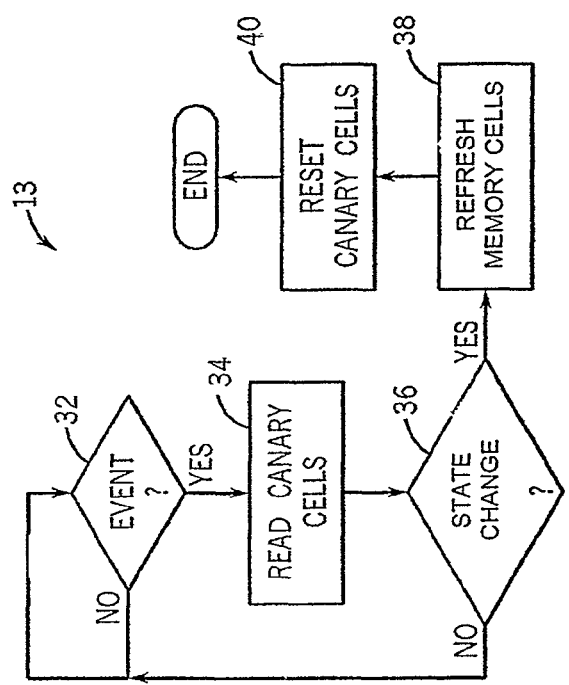
FIG. 2 is a flow chart for one embodiment.

Thus, referring to FIG. 2, in some embodiments, the sequence 13 may be implemented in software, hardware, or firmware. In a software implemented embodiment, the software may be implemented as a series of instructions executed by a computer or controller, such as the control 12. It could also be executed externally to the memory 10, such as by memory controller either on chip or off chip. In the software implemented embodiment, the sequence may be implemented by instructions which are stored in an appropriate computer readable medium, such as a semiconductor, optical, or magnetic memory. In one embodiment, the computer readable medium may be a storage within the control, storing instructions to implement the sequence 13, as indicated in FIG. 1. In other embodiments, the computer readable medium may be separate from the control 12.

Initially, as indicated in diamond 32, a check indicates that an event has occurred, such as a time has expired or a number of cycles have expired or a power on or power off event, to precipitate a check of the canary cells. In some cases, a check may also ensure that no active memory access operations are currently ongoing.

Then each of the canary cells is read, as indicated in block 34. A check at diamond 36 determines whether any of the canary cells have changed state from amorphous to crystalline or crystalline to amorphous, as the case may be. This may be confirmed by comparing the read state to the state stored in an appropriate table for the canary cells in one embodiment. If the state has changed, all the memory cells may be refreshed, as indicated in block 38, in one embodiment. Then the canary cells may also be reset back to their original program state, as indicated in block 40.

Figure 3:
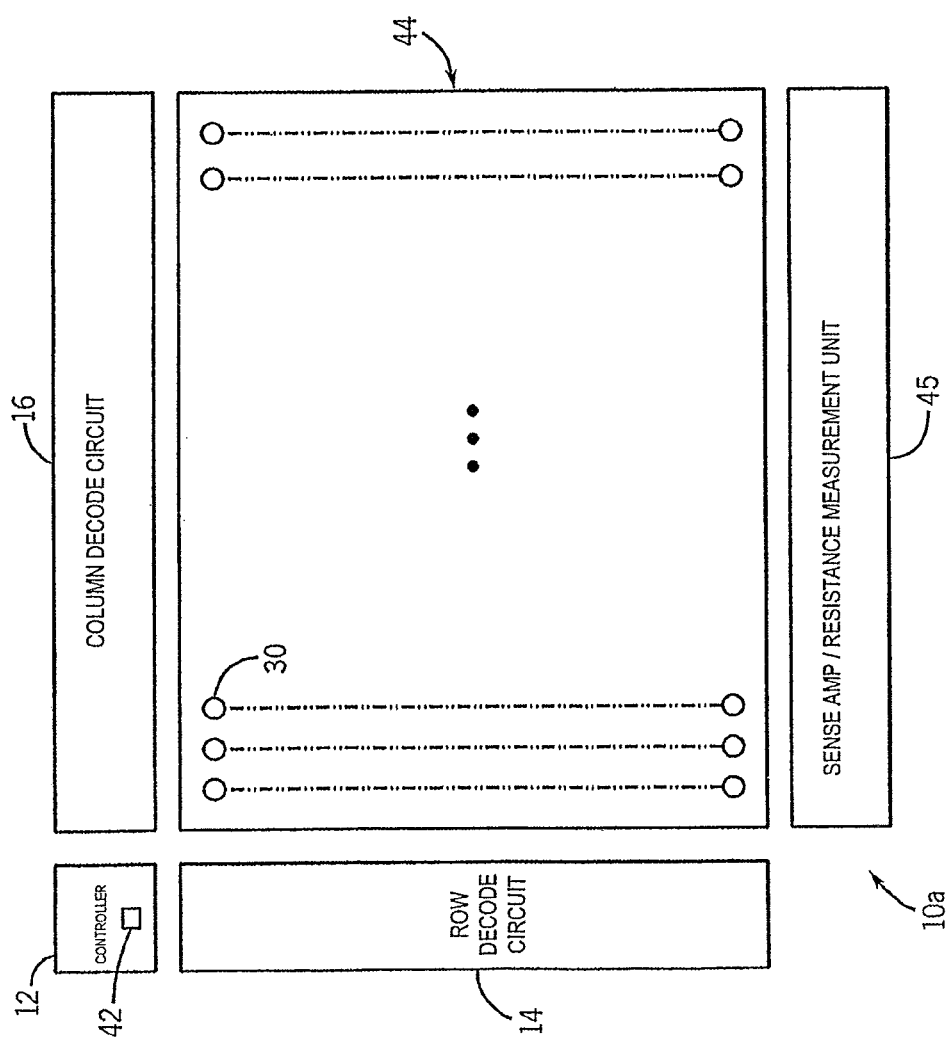
FIG. 3 is a schematic depiction of another embodiment of the present invention.
Figure 4:
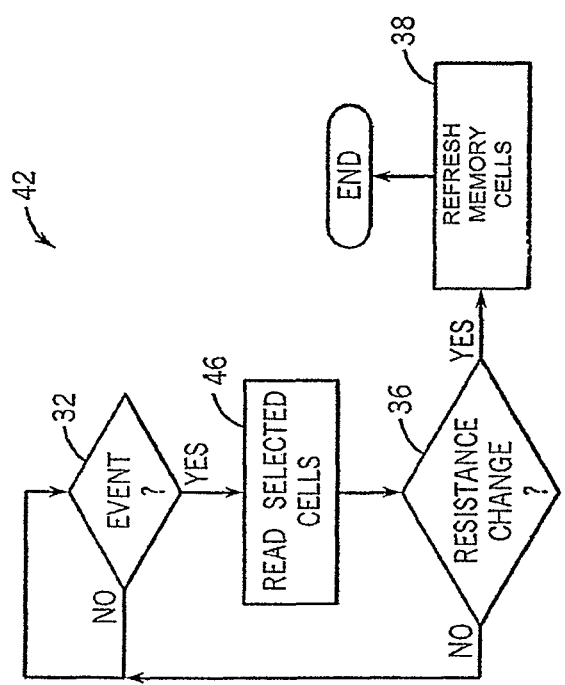
FIG. 4 is a flow chart for the embodiment of FIG. 3 in accordance with one embodiment.

Referring to FIG. 3, in accordance with one embodiment, instead of using canary cells, the memory 10a includes an array 44 that may be conventional in all respects. At periodic intervals, the entire array or selected cells 30 around the array may be sensed. During sensing, the state of the cells may be sensed to see if they have changed state from their previously programmed state without any intervening programming step. Alternatively, or in addition, the resistance level of the cells may be sensed using the sense amplifier/resistance measurement unit 45, to see if they have deviated from their programmed resistance as a result of thermal exposure. Normally, thermal exposure reduces resistance and, if enough cells have experienced a resistance reduction of sufficient magnitude, it may be deduced that thermal degradation has occurred or will soon occur and corrective action may be necessary. Thus, referring to FIG. 4, in accordance with one embodiment, a sequence 42 may be implemented in hardware, software, or firmware. In a software embodiment, the sequence 42 may be embodied in instructions stored in a computer readable medium, in this example, within the control 12 as indicated in FIG. 3. The computer readable medium may be a magnetic, optical, or semiconductor storage.

Initially, a check at diamond 32 determines whether an event has occurred. The event may be any of a variety of events, including an expiration of a time period, a power cycle, or a given number of cycles of operation. In response to the event, selected cells within the array may be read, as indicated at block 46. A check at diamond 36 determines whether the cells have experienced a resistance change. This may amount to determining whether their state has changed sufficiently or their resistance has changed sufficiently. The resistance may be determined by sensing the current in the sense amplifier and comparing the sensed current to a table which correlates sense current to resistance level.

Depending on the nature of the resistance change, including its direction and extent, a determination may be made as to whether thermal failure is imminent or has already occurred. If corrective action is needed, all of the cells in the array may be refreshed, as indicated in block 38. Generally, the resistance change may be determined by measuring the current, as one example, and comparing the current to a threshold to determine whether or not thermal issues have arisen.

Figure 5:
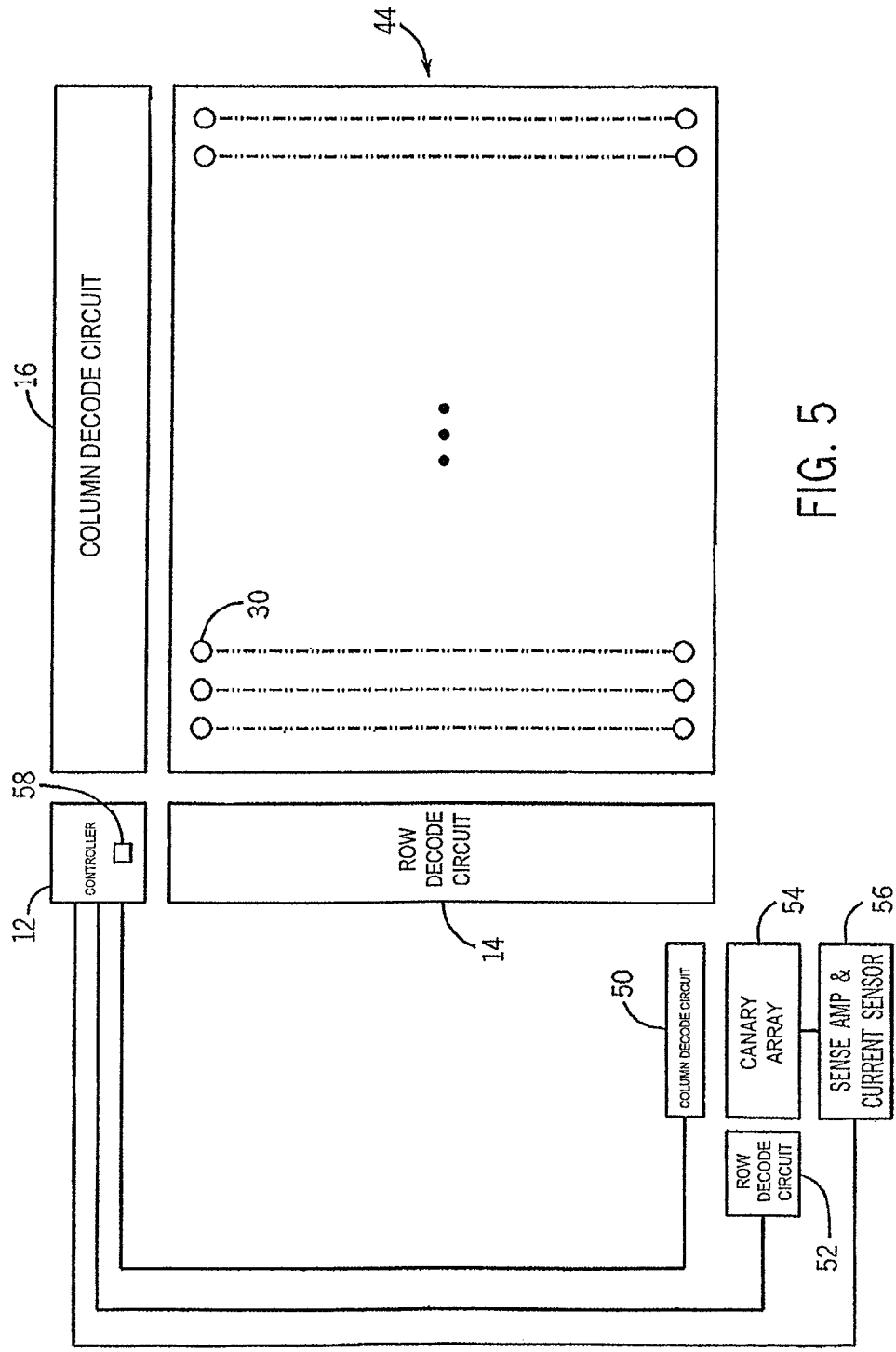
FIG. 5 is a schematic depiction of still another 10 embodiment of the present invention.
Figure 6:
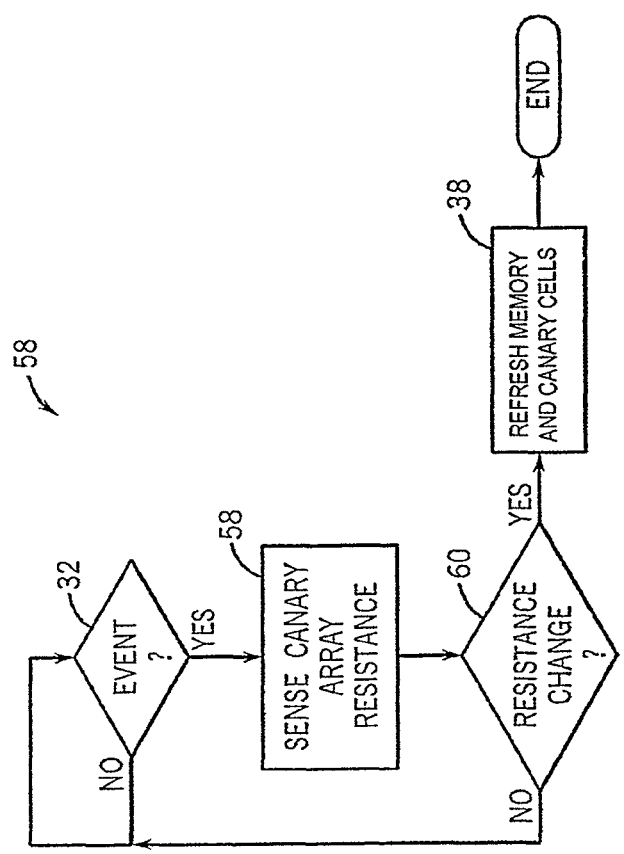
FIG. 6 is a flow chart for the embodiment of FIG. 5 in accordance with one embodiment.

Referring to FIG. 5, in accordance with still another embodiment of the present invention, a separate array 54 of canary cells may be controlled by the controller 12. The canary cells may be fabricated, as described in connection with FIG. 1, such that they may be more sensitive to thermal effects, in some embodiments. The controller 12 may control the column decode circuits 50 and the row decode circuits 52 for the canary array 54. In some embodiments, the array 44 may be conventional phase change memory cells 30. The array 54 of canary cells is coupled to a sense amplifier and current sensor 56. This device can determine whether or not the cells have changed from their program state. In one embodiment, the canary cells may be maintained in the reset or amorphous state and a check can determine whether or not they have transitioned to the crystalline state without any programming. This would be indicative of thermal induced reliability issues. In addition, the current of these cells may be measured and correlated to resistance levels. If the resistance levels have changed in a particular direction, typically to become more crystalline and more conductive, and by more than a threshold amount, it may be determined that the cells 30 in the array 44 are no longer reliable. Therefore, corrective action may be taken. Referring to FIG. 6, a sequence 58 may be implemented in software, hardware, or firmware. In a software implemented embodiment, the sequence 58 may be embodied instructions stored in a computer readable medium within the control 12, shown in FIG. 1, as one example. Of course, the sequence may be implemented in hardware or by instructions stored in any other computer readable medium.

Initially, a check at 32 determines whether an event has occurred which would precipitate checking the canary array 54. The canary array 54 may be sensed in such case as indicated in block 58. The sensing may determine whether the canary cells have changed state or, alternatively or in addition, whether their resistance has changed in a given direction and by a given amount. If there is a sufficient resistance shift, as determined in diamond 60, the array 44, cells 30, as well as the canary cell array 54, may be refreshed, as indicated in block 38. Otherwise, the flow recycles.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment' illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method, comprising:
sensing a resistance of a phase change test cell of a plurality of phase change test cells that are configured during fabrication to be more sensitive to thermal degradation than phase change memory cells of a phase change memory array by withholding doping of a material use to form the phase change test cell during application of the doping of the material used to form the phase change memory cells of the phase change memory array, wherein sensing the resistance of the phase change test cell only occurs while no other operation is going on within the phase change memory array, wherein the phase change memory array includes the plurality of phase change test cells located at each corner and at a center of the phase change memory array;
determining whether the sensed resistance of the phase change test cell is within a tolerance range of an initial value; and
refreshing the phase change memory array responsive to a determination that the sensed resistance of the phase change test cell is outside the tolerance range of the initial value.

2. The method of claim 1, wherein determining whether the sensed resistance of the phase change test cell is within the tolerance range of the initial value comprises comparing the sensed resistance to a threshold value.

3. The method of claim 1, further comprising storing the initial value of the phase change test cell as a threshold value.

4. The method of claim 3, further comprising measuring the initial resistance value of the phase change test cell.

5. The method of claim 1, further comprising refreshing the phase change memory array responsive to the determination that the sensed resistance of the phase change test cell is less than the initial value.

6. The method of claim 1, further comprising refreshing the phase change memory array responsive to the determination that the sensed resistance of the phase change test cell is not equal to the initial value.

7. A method, comprising:
writing data to a phase change test cell that is configured during fabrication to be more sensitive to thermal degradation than phase change memory cells of a phase change memory array by withholding doping of a material used to form the phase change test cell during application of the doping of the material used to form the phase change memory cells of the phase change memory array, wherein the data is associated with an initial state of the phase change test cell, wherein the phase change memory array includes the plurality of phase change test cells located at each corner and at a center of the phase change memory array;
determining a state of the phase change test cell, wherein determining the state of the phase change test cell occurs while no other operation is going on within the phase change memory array; and
refreshing the phase change memory array responsive to the state of the phase change test cell changing from the initial state.

8. The method of claim 7, further comprising comparing the state of the phase change test cell with the initial state.

9. The method of claim 7, further comprising resetting the phase change test cell after refreshing the phase change memory array.

10. The method of claim 7, wherein determining the state of the phase change test cell is responsive to detection of an event.

11. The method of claim 10, wherein the event comprises at least one of a power cycle, a number of read cycles, a number of write cycles, a time out, or combinations thereof.

12. The method of claim 7, further comprising verifying the state of the phase change test cell responsive to the state of the phase change test cell changing from the initial state.

13. The method of claim 7, wherein determining the state of the phase change test cell comprises determining a crystalline or amorphous state of the phase change test cell.

* * * * *